(12) United States Patent
Vaara et al.

(10) Patent No.: US 10,205,902 B2
(45) Date of Patent: Feb. 12, 2019

(54) SEMICONDUCTOR CHIP, A METHOD, AN APPARATUS AND A COMPUTER PROGRAM PRODUCT FOR IMAGE CAPTURING

(71) Applicant: Nokia Technologies Oy, Espoo (FI)

(72) Inventors: Markku Vaara, Tupos (FI); Kim Gronholm, Helsinki (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 15/528,830

(22) PCT Filed: Nov. 19, 2015

(86) PCT No.: PCT/FI2015/050802
§ 371 (c)(1),
(2) Date: May 23, 2017

(87) PCT Pub. No.: WO2016/083664
PCT Pub. Date: Jun. 2, 2016

(65) Prior Publication Data
US 2017/0339364 A1  Nov. 23, 2017

(30) Foreign Application Priority Data
Nov. 25, 2014 (GB) .................................. 1420881.3

(51) Int. Cl.
*H04N 5/374* (2011.01)
*H04N 5/353* (2011.01)
(Continued)

(52) U.S. Cl.
CPC ... *H04N 5/37455* (2013.01); *H01L 27/14603* (2013.01); *H01L 27/14605* (2013.01);
(Continued)

(58) Field of Classification Search
CPC .... H04N 5/37455; H04N 5/353; H04N 5/378; H04N 5/3745; H01L 27/14607;
(Continued)

(56) References Cited

U.S. PATENT DOCUMENTS

2007/0045680 A1* 3/2007 Ladd ..................... H01L 31/113
257/291
2010/0045837 A1* 2/2010 Yamashita ............. H04N 5/335
348/308

(Continued)

OTHER PUBLICATIONS

International Search Report and Written Opinion received for corresponding Patent Cooperation Treaty Application No. PCT/FI2015/050802, dated Feb. 16, 2016, 14 pages.

*Primary Examiner* — Marly S Camargo
(74) *Attorney, Agent, or Firm* — Nokia Technologies Oy

(57) ABSTRACT

The invention relates to a structure of a semiconductor chip (100) comprising photosensitive elements (104) for image capturing. The semiconductor chip (100) comprises a set of photosensitive elements (104) for forming electric signals on the basis of electromagnetic radiation received by the photosensitive elements (104); and other electronic circuitry. A surface of the semiconductor chip comprises a first region (102) and a second region (110); and the set of photosensitive elements (104) is located in the first region (102) and the other electronic circuitry is located in the second region (110). The invention also relates to methods, apparatuses, and computer program products.

18 Claims, 7 Drawing Sheets

(51) Int. Cl.
  *H04N 5/378*    (2011.01)
  *H01L 27/146*   (2006.01)
  *H04N 5/3745*   (2011.01)
  *H04N 5/369*    (2011.01)
  *H04N 5/357*    (2011.01)

(52) U.S. Cl.
  CPC .. *H01L 27/14607* (2013.01); *H01L 27/14609* (2013.01); *H01L 27/14625* (2013.01); *H04N 5/353* (2013.01); *H04N 5/3572* (2013.01); *H04N 5/3696* (2013.01); *H04N 5/378* (2013.01); *H04N 5/3745* (2013.01)

(58) Field of Classification Search
  CPC ......... H01L 27/14609; H01L 27/14605; H01L 27/14625
  USPC ................ 348/308, 231.99, 294, 36, 45, 65; 250/208.1; 257/291, 292, 448, 432; 438/98, 70
  See application file for complete search history.

(56) References Cited

U.S. PATENT DOCUMENTS

| | | |
|---|---|---|
| 2013/0182162 A1 | 7/2013 | Hirayama et al. |
| 2013/0334641 A1* | 12/2013 | Suzuki .............. H01L 31/02325 257/432 |
| 2014/0036119 A1 | 2/2014 | Shimomura et al. |
| 2014/0333719 A1 | 11/2014 | Williams |
| 2016/0284753 A1* | 9/2016 | Komai .............. H01L 27/14632 257/432 |
| 2017/0092681 A1* | 3/2017 | Umebayashi ..... H01L 27/14643 257/432 |

* cited by examiner

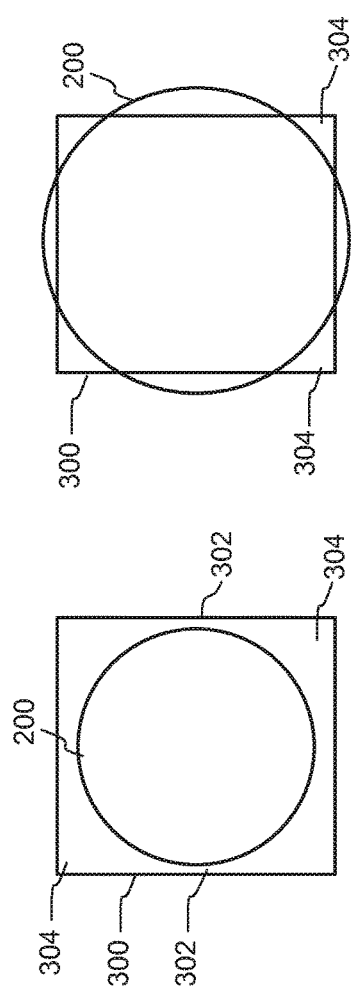
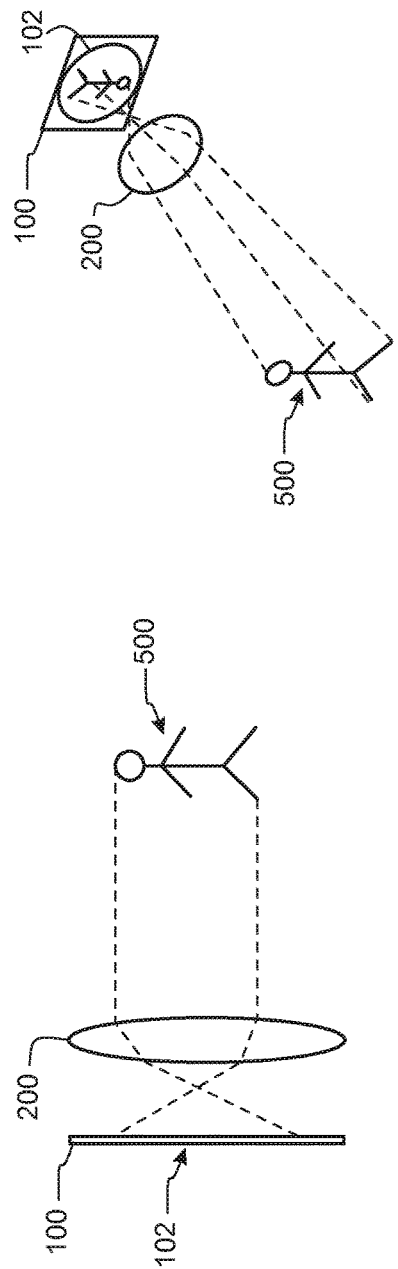

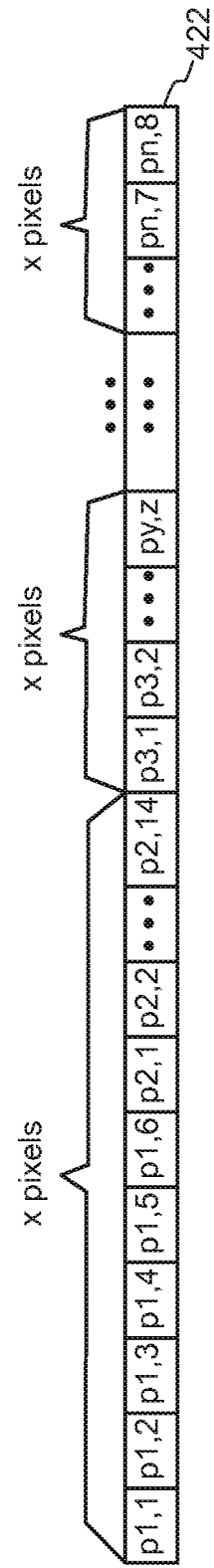

SEMICONDUCTOR CHIP, A METHOD, AN APPARATUS AND A COMPUTER PROGRAM PRODUCT FOR IMAGE CAPTURING

RELATED APPLICATION

This application was originally filed as Patent Cooperation Treaty Application No. PCT/FI2015/050802 filed Nov. 19, 2015 which claims priority benefit to GB Patent Application No. 1420881.3, filed Nov. 25, 2014.

TECHNICAL FIELD

The present embodiments relate generally to image capturing. In particular, the present embodiments relate to a structure of a semiconductor chip comprising photosensitive elements for image capturing.

BACKGROUND

Many image sensors used in digital cameras and other equipment having an imaging apparatus are manufactured on silicon-based substrates. Some examples of such sensors are charge-coupled device sensors (CCD) and complementary metal oxide semiconductors (CMOS). Such camera sensors have an array of photoactive (photosensitive) detectors, pixel sensors, in which each pixel may also comprise an active amplifier for amplifying the electric signal generated by the photoactive detector when it receives electromagnetic radiation (light). Usually the pixels of the image sensor are arranged in rectangular form, wherein the image sensor silicon die is a rectangle or a square.

Imaging apparatuses may also comprise one or more lenses in an optical path to provide visual information of a scene in front of the imaging apparatus on the photoactive detectors of the image sensor. If the lens or lenses have a very large wide field-of-view (180 degrees or more), they may also be called as super wide field-of-view lenses.

Lenses of imaging apparatuses may be round, wherein they draw round images on the image sensor. It may also happen that some parts of the image on the sensor are distorted.

SUMMARY

Various embodiments of the invention include a semiconductor chip, a method, an apparatus, and a computer readable medium comprising a computer program stored therein, which are characterized by what is stated in the independent claims. Various embodiments of the invention are disclosed in the dependent claims.

According to a first example, a semiconductor chip comprises at least a set of photosensitive elements for forming electric signals on the basis of electromagnetic radiation received by the photosensitive elements; and other electronic circuitry; wherein a surface of the semiconductor chip comprises a first region and a second region; and that the set of photosensitive elements is located in the first region and the other electronic circuitry is located in the second region.

According to a second example, a method comprises communicating with a set of photosensitive elements in a first region of a semiconductor chip to obtain electric signals formed by the set of photosensitive elements on the basis of electromagnetic radiation received by the photosensitive elements; and communicating with other electronic circuitry in a second region of a semiconductor chip for other purposes than obtaining electric signals from the photosensitive elements.

According to a third example, an apparatus comprises at least one processor, memory including computer program code, the memory and the computer program code configured to, with the at least one processor, cause the apparatus to perform at least the following: communicating with a set of photosensitive elements in a first region of a semiconductor chip to obtain electric signals formed by the set of photosensitive elements on the basis of electromagnetic radiation received by the photosensitive elements; and communicating with other electronic circuitry in a second region of a semiconductor chip for other purposes than obtaining electric signals from the photosensitive elements.

According to a fourth example, an apparatus comprises: means for communicating with a set of photosensitive elements in a first region of a semiconductor chip to obtain electric signals formed by the set of photosensitive elements on the basis of electromagnetic radiation received by the photosensitive elements; and means for communicating with other electronic circuitry in a second region of a semiconductor chip for other purposes than obtaining electric signals from the photosensitive elements.

According to a fifth example, a computer program product embodied on a non-transitory computer readable medium, comprising computer program code configured to, when executed on at least one processor, cause an apparatus or a system to: communicate with a set of photosensitive elements in a first region of a semiconductor chip to obtain electric signals formed by the set of photosensitive elements on the basis of electromagnetic radiation received by the photosensitive elements; and communicate with other electronic circuitry in a second region of a semiconductor chip for other purposes than obtaining electric signals from the photosensitive elements.

According to a sixth example, an imaging apparatus comprising at least:
  a semiconductor chip having a set of photosensitive elements in a first region for forming electric signals on the basis of electromagnetic radiation received by the photosensitive elements; and other electronic circuitry;
  at least one lens for receiving electromagnetic radiation by at least one lens, and directing the received electromagnetic radiation to the first region as a visual image having a circumference corresponding to a circumference of the first region.
wherein a surface of the semiconductor chip further comprises second region having other electronic circuitry than photosensitive elements.

DESCRIPTION OF THE DRAWINGS

In the following, various embodiments of the invention will be described in more detail with reference to the appended drawings, in which
FIG. 4a shows an example of a fish eye lens on top of over-sized rectangular camera sensor;
FIG. 4b shows an example of an over-sized fish eye lens and a rectangular camera sensor inside the lens area;
FIG. 5a depicts as a simplified view an optical path from an object in a scene to a semiconductor chip;

FIG. 5b shows the example optical path as a simplified perspective view;

FIG. 10 illustrates an example of arranging pixel data in an image memory; and

FIG. 11 illustrates another example of arranging pixel data in an image memory.

DESCRIPTION OF EXAMPLE EMBODIMENTS

Figure 2:
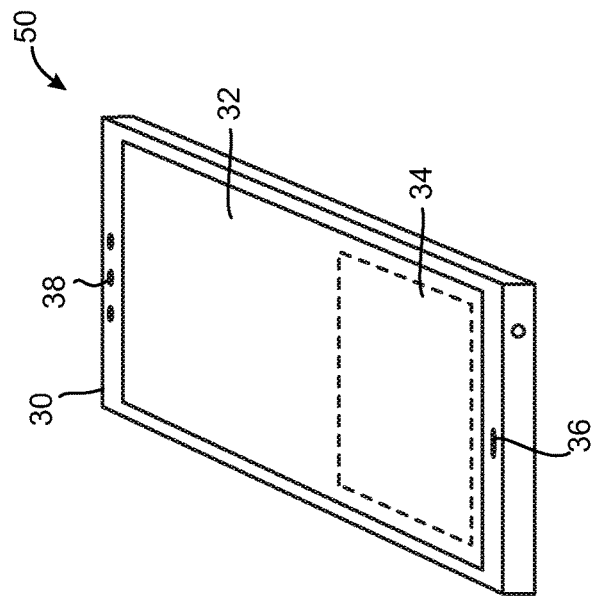
FIG. 2 shows a layout of an apparatus according to an embodiment.
Figure 1:
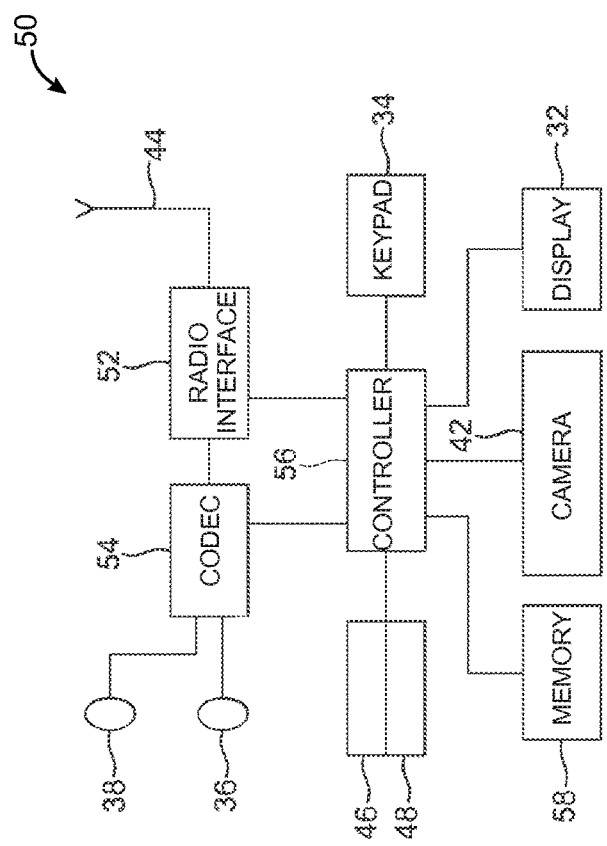
FIG. 1 shows an apparatus according to an embodiment.

FIGS. 1 and 2 illustrate an apparatus according to an embodiment. The apparatus 50 is an electronic device, for example a mobile terminal or a user equipment of a wireless communication system (e.g. a cellular phone, a personal digital assistant (PDA), a smartphone, a tablet computer or the like), a camera device, a web camera, a surveillance camera, a tv or a monitor for a computer. The embodiments disclosed in this application can be implemented within any electronic device or apparatus which is able to capture digital images, such as still images and/or video images. The electronic device or apparatus may be connectable to a network. The apparatus 50 may comprise a housing 30 for incorporating and protecting the device. The apparatus 50 further may comprise a display 32, for example, a liquid crystal display or any other display technology capable of displaying images and/or videos. The apparatus 50 may further comprise a keypad 34. According to another embodiment, any suitable data or user interface mechanism may be employed. For example, the user interface may be implemented as a virtual keyboard or data entry system as part of a touch-sensitive display. The apparatus may comprise a microphone 36 or any suitable audio input which may be a digital or analogue signal input. The apparatus 50 may further comprise an audio output device, which may be any of the following: an earpiece 38, a speaker or an analogue audio or digital audio output connection. The apparatus 50 may also comprise a battery (according to another embodiment, the device may be powered by any suitable mobile energy device, such as solar cell, fuel cell or clockwork generator). The apparatus may comprise a camera 42 capable of recording or capturing images and/or video, or may be connected to one. According to an embodiment, the apparatus 50 may further comprise an infrared port for short range line of sight communication to other devices. According to an embodiment, the apparatus 50 may further comprise any suitable short range communication solution such as for example a Bluetooth wireless connection or a USB/firewire wired solution.

The apparatus 50 may comprise a controller 56 or processor for controlling the apparatus. The controller 56 may be connected to memory 58 which, according to an embodiment, may store both data in the form of image and audio data and/or may also store instructions for implementation on the controller 56. The controller 56 may further be connected to codec circuitry 54 suitable for carrying out coding and decoding or audio and/or video data or assisting in coding and decoding carried out by the controller 56.

The apparatus 50 may further comprise a card reader 48 and a smart card 46, for example a UICC and UICC reader for providing user information and being suitable for providing authentication information for authentication and authorization of the user at a network.

The apparatus 50 may comprise radio interface circuitry 52 connected to the controller and suitable for generating wireless communication signals for example for communication with a cellular communications network, a wireless communications system or a wireless local area network. The apparatus 50 may further comprise an antenna 44 connected to the radio interface circuitry 52 for transmitting radio frequency signals generated at the radio interface circuitry 52 to other apparatus(es) and for receiving radio frequency signals from other apparatus(es).

According to an embodiment, the apparatus 50 comprises a camera 42 capable of recording or detecting individual frames which are then passed to the codec 54 or controller for processing. According to an embodiment, the apparatus may receive the video image data for processing from another device prior to transmission and/or storage. According to an embodiment, the apparatus 50 may receive the images for processing either wirelessly or by a wired connection.

Figure 3:
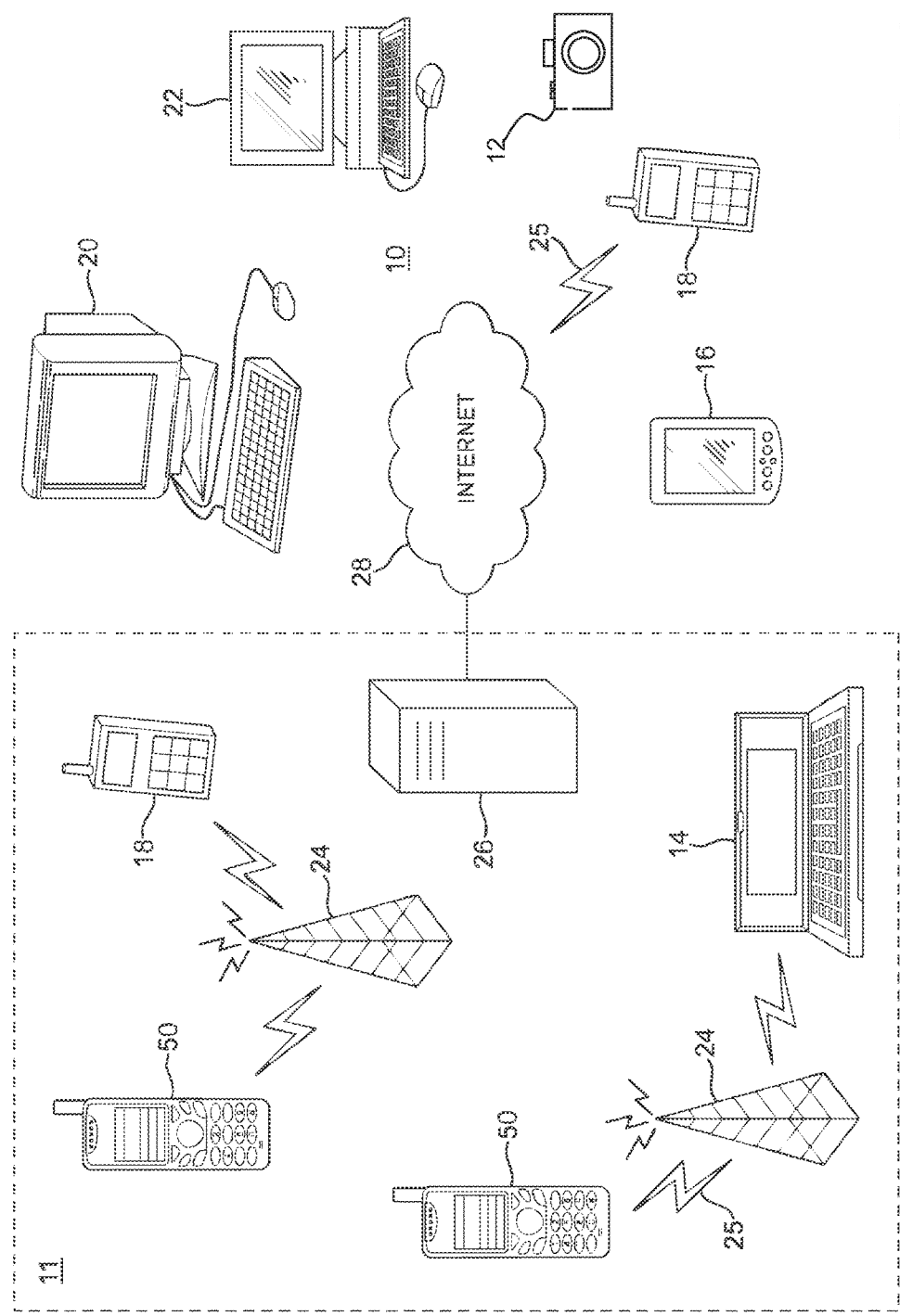
FIG. 3 shows a system according to an embodiment.

FIG. 3 shows a system configuration comprising a plurality of apparatuses, networks and network elements according to an embodiment. The system 10 comprises multiple communication devices which can communicate through one or more networks. The system 10 may comprise any combination of wired or wireless networks including, but not limited to a wireless cellular telephone network (such as a GSM, UMTS, CDMA network, etc.), a wireless local area network (WLAN), such as defined by any of the IEEE 802.x standards, a Bluetooth personal area network, an Ethernet local area network, a token ring local area network, a wide area network, and the internet.

The system 10 may include both wired and wireless communication devices or apparatus 50 suitable for implementing present embodiments. For example, the system shown in FIG. 3 shows a mobile telephone network 11 and a representation of the internet 28. Connectivity to the internet 28 may include, but is not limited to, long range wireless connections, short range wireless connections, and various wired connections including, but not limited to, telephone lines, cable lines, power lines, and similar communication pathways.

The example communication devices shown in the system 10 may include but are not limited to, an electronic device or apparatus 50, a combination of a personal digital assistant (PDA) and a mobile telephone 14, a PDA 16, an integrated messaging device (IMD) 18, a desktop computer 20, a notebook computer 22, a digital camera 12. The apparatus 50 may be stationary or mobile when carried by an individual who is moving. The apparatus 50 may also be located in a mode of transport.

Some of further apparatus may send and receive calls and messages and communicate with service providers through a wireless connection 25 to a base station 24. The base station 24 may be connected to a network server 26 that allows communication between the mobile telephone network 11 and the internet 28. The system may include additional communication devices and communication devices of various types.

The communication devices may communicate using various transmission technologies including, but not limited to, code division multiple access (CDMA), global systems for mobile communications (GSM), universal mobile telephone system (UMTS), time divisional multiple access (TDMA), frequency division multiple access (FDMA), transmission control protocol-internet protocol (TCP-IP), short messaging service (SMS), multimedia messaging service (MMS), email, instant messaging service (IMS), Bluetooth, IEEE 802.11 and any similar wireless communication technology. A communications device involved in implementing various embodiments of the present invention may communicate using various media including, but not limited to, radio infrared, laser, cable connections or any suitable connection.

The present embodiments relate to utilizing a part of a semiconductor chip 100 as an image sensor and another part of the semiconductor chip 100 for performing other processes.

FIG. 4a illustrates an example in which a lens 200 is located on top of a rectangular image sensor 300 which is larger than the image formed by the lens 200 on the surface of the image sensor 300, i.e. the image sensor 300 may be regarded as an over-sized image sensor. It can be seen that the image which the lens 200 forms on the image sensor 300 is round and fills only a round section of the image sensor 300 and pixels at the edges 302 and corners 304 are not receiving visual information from the lens 200. Hence, some pixels of the image sensor may not be used at all in the image capturing process. FIG. 4b illustrates a corresponding situation in which the lens 200 is over-sized i.e. some parts of the visual information from the lens 200 is drawn outside the rectangular image sensor 300. Also in this example at least pixels at the corners 304 of the imaging sensor are not receiving visual information from the lens 200.

FIGS. 5a and 5b depict as simplified views how the visual information in front of the image capturing device may be formed on the surface of the first region 102 of the semiconductor chip 100. In FIG. 5a a simplified side view shows the optical path from the object 500 in a scene to the semiconductor chip 100, and FIG. 5b shows the example optical path as a simplified perspective view. In these illustrations only one lens 200 is depicted but in practical implementations the optical system of the image capturing device may comprise more than one lens 200. If the lens(es) 200 is/are round also the image formed on the semiconductor chip 100 may be substantially round. However, the optical system may induce some distortions to the visual image so that the outline of the image may not totally correspond with the outline of the lens(es).

Figure 6:
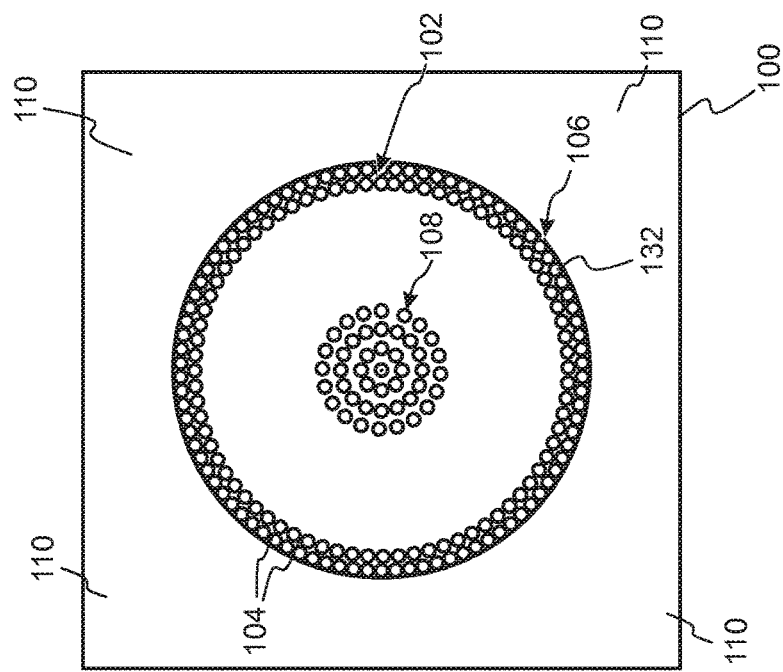
FIG. 6 shows an example of a round camera sensor area with additional features on corners in unused pixel area, in accordance with an embodiment.

In the following a principle of a structure of a semiconductor chip 100 according to an example embodiment is depicted with reference to FIG. 6. The semiconductor chip 100 comprises at least two different regions. A first region 102 comprises photosensitive elements 104 for transforming electromagnetic radiation (visual information) to electric signals. Those photosensitive elements 104 may also be called as pixel elements or pixels. In other words, the pixel elements 104 transform visual information which they receive from the lens 200 to electric signals. Although the pixel elements are depicted in FIG. 6 as squares, in practical implementations they need not be squares but may also have another form. Also the number of pixel elements in the first region 102 may be different than what is depicted in FIG. 6. In accordance with an embodiment the first region 102 of the semiconductor chip which comprises the pixels is also substantially round and the size of the first region 102 may substantially correspond with the visual image which the optical system of the image capturing device forms on the surface of the semiconductor chip 100. Hence, no significant amounts of pixels 104 of the semiconductor chip 100 are outside the visual image and, correspondingly, no significant amounts of the visual image are outside the pixels 104 of the semiconductor chip 100. In practical implementations the border of the first region may not be accurately at the border of the visual image but some variations may occur. In FIG. 6 this is illustrated so that the circle 132 is located on some pixel elements 104 at the border of the first region 102. The set of pixel elements 104 may also be called as an image sensor 105.

The semiconductor chip 100 also comprises one or more second regions 110 provided with circuitry which is intended to perform other operations than transforming visual information to electric signals. The one or more second regions 110 of the semiconductor chip 100 may be utilized to implement electronic circuitry for many kinds of operations. Those operations may relate to processing further electric signals from the pixel elements 104, controlling the operation of the pixel elements 104, providing memory for storing information regarding visual information captured by the pixel elements 104, providing control to other circuitry of an apparatus 50, etc. For example, the other electronic circuitry may comprise analog-to-digital converters, amplifiers, memory, interface circuitry, and/or one or more processors. It should be noted that the above mentioned operations are non-limiting examples only and some or all of the operations provided by the electronic circuitry of the second region(s) 110 need not be related to image capturing or the operation of the pixel elements 104. Details on the electronic circuitry of the second regions 110 are not drawn in the Figures due to e.g. the fact that the electronic circuitry may vary depending on the operations they are intended to perform.

The pixel elements 104 may be coupled to amplifiers which may amplify the electric signals formed by the pixel elements 104 before the electric signals are converted to digital values. In an embodiment an individual amplifier is provided for each pixel element. The amplifiers may be located within the first region 102 or outside the first region 102, e.g. in the second region(s) 110.

Figure 7:
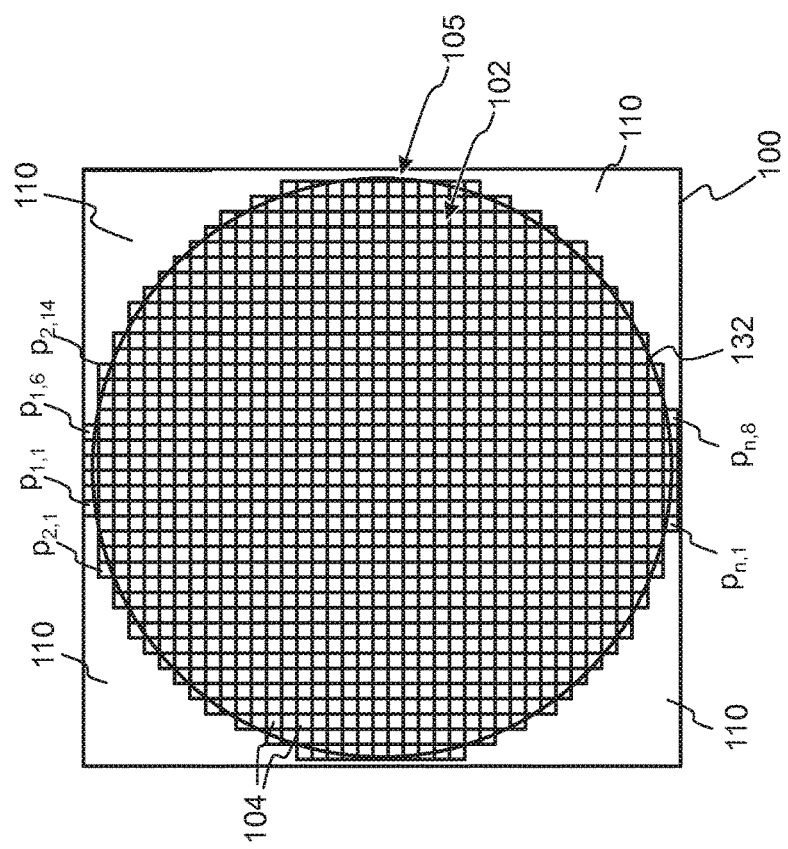
FIG. 7 shows an example of a camera sensor in which pixel density is higher closer to an edge of a camera sensor, in accordance with an embodiment.

FIG. 7 shows an example of a semiconductor chip 100 in which pixel density is not constant within the first region 102 of the semiconductor chip but changes towards the edges 106 of the first region 102. For example, the pixel density may be higher closer to the edge 106 of first region than in the centre part 108 of the first region. This kind of structure may make it easier to compensate possible distortions caused by the lens(es) 200 of the image capturing device 400. In FIG. 7 circles illustrate the pixel elements, but only some of the pixel elements at the centre part 108 and near the edge 106 are depicted for clarity. In practice, pixel elements are also formed in the region between the centre part 108 and the edge 106.

The semiconductor chip 100 in accordance with an embodiment, may be manufactured in the same way than other kinds of semiconductor chips are manufactured. Some main steps of a manufacturing method in accordance with an embodiment are briefly described in the following. An ingot may be made of a very pure semiconductor material such as silicon or germanium. The ingot may be sliced into a plurality of semiconductor wafers which are then polished and processed further. The further processing may include forming layers on the surface of the semiconductor wafer, patterning different layers to form the desired circuitry, and depositing interconnection metals to provide connections to and from the semiconductor chip. A plurality of semiconductor chips may be formed on one semiconductor wafer. Hence, once the desired circuitries have been formed on the semiconductor wafer, individual semiconductor chips may be separated from the semiconductor wafer. The semiconductor chips may then be placed in a housing which comprises connectors to be used when connecting the semiconductor chip with other electronics of a device.

The circuitry of the semiconductor chip 100 in accordance to an embodiment is designed so that the first region 102 comprises the pixel elements and the one or more second regions 110 comprise other electronic circuitry.

Figure 8:
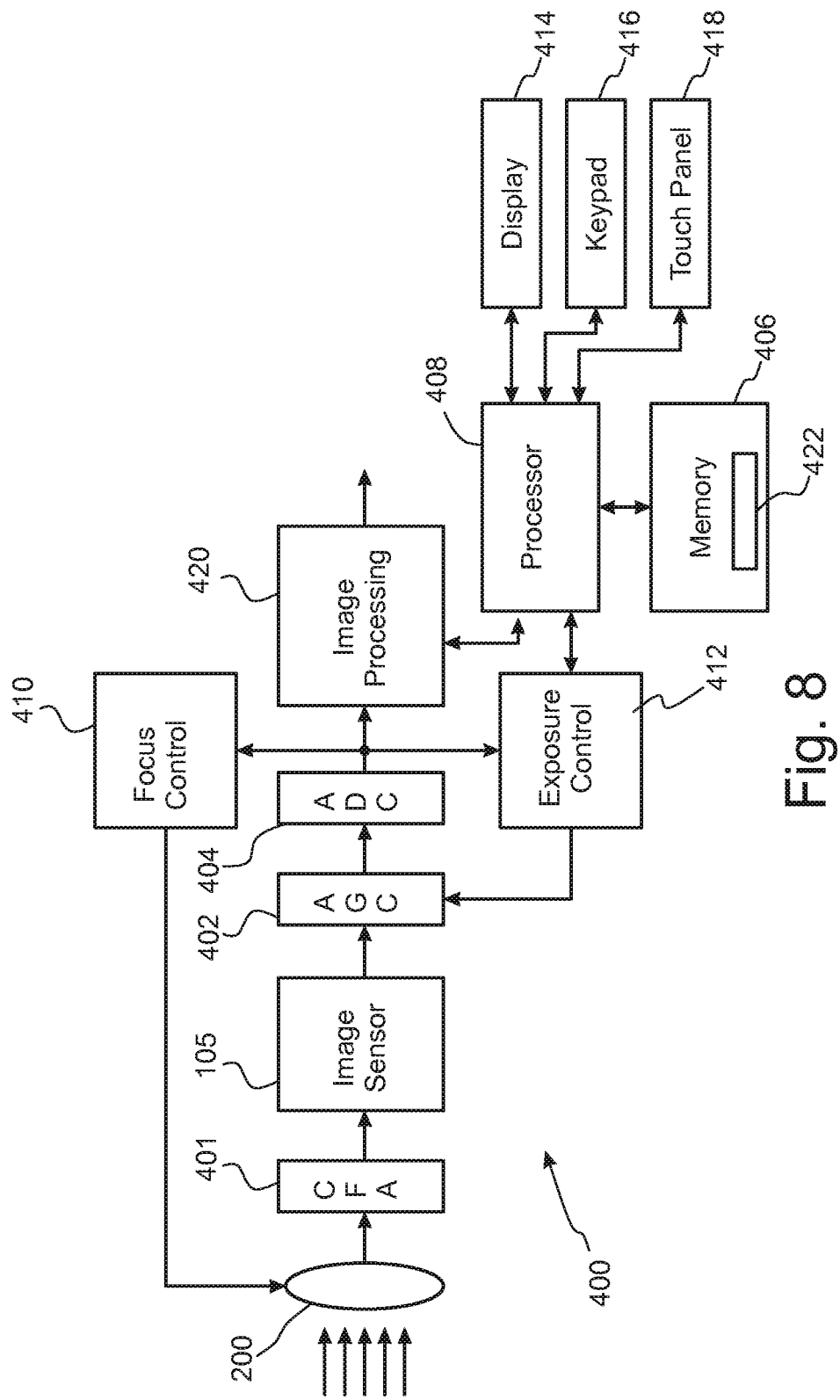
FIG. 8 shows some details of an image capturing device as a simplified block diagram in accordance with an embodiment.

FIG. 8 shows some details of an image capturing device 400 as a simplified block diagram, in accordance with an embodiment. A colour filter 401 may be provided in front of the image sensor 105 so that image sensor 105 may be capable to produce colour related pixel information, e.g. red, green and blue (RGB) colour data. Information from the image sensor 105 may be amplified by amplifiers 402, the gain of which may be automatically controlled (automatic gain control, AGC), wherein the amplified signals may be converted to digital pixel information by analog-to-digital converter(s) (ADC) 404. The digital pixel information may then be stored into memory 406 e.g. for later utilization. The processor 408 may be used to control the image capturing processes and other operations of the image capturing device 400. The processor may also retrieve the captured image from the memory and send the image information to the display 414. The processor 408 may control the image sensor 105 so that it continuously captures images and the captured images are stored into the memory and also shown on the display 414, wherein the sequence of images may be used e.g. as a view finder.

FIG. 8 also depicts a focus control block 410 and an exposure control block 412, which may be used to control the focus of the lenses 200 and exposure of the image capturing process, respectively.

A user of the image capturing device 400 may provide control instructions and other input information to the image capturing device 400 e.g. by a keypad 416, a touch panel 418 and/or by some other input means. The processor 408 may recognize input instructions by the user and initiate appropriate operations in the image capturing device 400. For example, the user may press an image capturing button wherein the processor 408 may instruct the image sensor 105 to capture an image. The captured image may then be stored to the memory 406 and also shown by the display 414. The image may be stored in one or more different image formats. For example, the image may be stored as a raw format and/or in JPEG-format (Joint Photographic Experts Group) and/or in MPEG-3 format (Motion Picture Experts Group), and/or in MPEG-4 format, Exif (Exchangeable Image File Format), TIFF (Tagged Image File Format), GIF (Graphic Interchange Format), BMP (Bitmap), etc. Some of these formats may provide images obtained by a lossy compression, such as JPEG, MPEG-3, MPEG-4, and some of them may provide images without lossless compression, such as BMP. Some formats, e.g. Exif, may also provide metadata, which may comprise information about the capturing event, such as date, time, camera settings, shutter settings, exposure, image size, compression, colour information.

The display 414, keypad 416, a touch panel 418 and/or by some other input means mentioned above need not belong to the image capturing device 400 but may be, for example, part of the apparatus 50 depicted in FIG. 1.

The processor 408 may also control the interface of the image capturing device 400 to communicate with other equipment(s)/apparatus(es). For example, the image capturing device 400 may be in communication connection with the apparatus 50 of FIG. 1, or the image capturing device 400 may be part of the apparatus 50, e.g. the camera 42. If the image capturing device 400 is a part of the apparatus 50, the processor 408 of the image capturing device 400 may be common with or separate from the controller 56 of the apparatus 50. Also the memory 406 may be separate or a part of the memory 58 of the apparatus 50.

In the following some examples of converting the captured pixel information into image information are described in more detail with reference to FIGS. 6 and 9. Because the pixel area of the image sensor 105 in accordance with an embodiment is not rectangular and final images are often rectangular, some information may be needed to determine the correspondence between the location of a pixel of the image sensor 105 and the location of the pixel in the final image. This information may be called as mapping information in this specification. Furthermore, the mapping information may be different in different implementations. In FIG. 6 some of the pixels are marked with labels $p_{1,1}, p_{1,6}, \ldots, p_{n,1}, p_{n,8}$ indicating the locations of the pixels in the image sensor. These labels may be used to clarify the image capturing operation according to an embodiment. The first number of the label indicates the row in which the pixel is located and the second number indicates the order of the pixel in the row. For example, $p_{1,6}$ depicts a sixth pixel in the first row whereas $p_{n,1}$ depicts a first pixel in the nth row. This is not the only possibility to address the pixels but also other possibilities exists. It should also be noted that the pixels need not be arranged in such a matrix form in the first region 102, as can be seen from the example of FIG. 7.

The pixels in the array may be addressed individually, row-by-row, column-by-column, or the pixels may be divided into other kinds of subsets wherein the pixels may be addressed subset-by-subset. In the following the row-by-row addressing scheme is used. The controller 408 may instruct the image sensor 105 to begin the image capturing (block 910 in FIG. 9). Then, in the row-by-row capturing mode pixels of the first row may first be reset (block 912) after which they will begin charging the speed of which depends inter alia on the amount of light the pixels receive. The next row may be reset next and so on until all rows have been reset or until the exposure time has lapsed (block 914). When the exposure time has lapsed, charges collected by the pixels will be read row-by-row beginning from the first pixel in this example (block 916). When all rows have been read the process may be repeated to capture a new image.

The analog-to-digital converter may convert each pixel of one row into corresponding digital values at once if the analog-to-digital converter is implemented for each row, or if only one analog-to-digital converter is used, pixels of one row need to be converted one after the other. In the following it is assumed that the analog-to-digital converter is provided for each row. When the analog-to-digital converting is performed (block 918), the obtained digital values may be stored into the memory 406 (block 920).

The memory area which is reserved for storing a captured image may be organized in a so-called rectangular form, i.e. the first pixel of the first row may be stored to a first location in the memory area, the second pixel of the first row may be stored to a second location in the memory area, etc. If the number of pixels in the longest column of the image sensor is n and the number of pixels in the longest row of the image sensor is m, the memory area reserved for the image may be expressed as an n×m storage.

Using the image sensor of FIG. 6 as an example, reading the first row might affect that some of the analog-to-digital converters produce digital values which are not related to any pixels. In this example, only those analog-to-digital converters which are coupled to the pixels marked with labels $p_{1,1} \ldots p_{1,6}$ would produce digital values which represent the corresponding pixel values. The other values may be omitted in further processing. Hence, the image processing block 420 uses only those pixel values which represent real pixels. The image processing block 420 may be provided with a mapping table which indicates the correspondence between the memory location and an actual pixel.

As the rows of the image sensor do not have the same amount of pixels different amount of pixel data need to be stored into the memory for each row. Hence, the memory area reserved for captured images need not be rectangular but may comprise only the required amount of storage locations for an image. Hence, also in this alternative the image processing block 420 may be provided with a mapping table which indicates the correspondence between the memory location and an actual pixel. FIG. 10 illustrates an example of arranging pixel data in an image memory 422 using this principle.

On the other hand, to make read-out times faster and/or to obtain lower power consumption, the image capturing process may also be performed in such a way that only those pixels are processed by the analog-to-digital converters which actually exist in the image sensor. Using again the example of FIG. 6, reading the first row would result that only analog-to-digital converters which are coupled to the pixels marked with labels $p_{1,1} \ldots p_{1,6}$ would be used, reading the second row would result that only analog-to-digital converters which are coupled to the pixels marked with labels $p_{2,1} \ldots p_{2,14}$ would be used, etc.

It may also be possible to implement the control logic for reading the pixel values in such a way that the pixels are divided into groups (subsets) of equal amount of pixels and an equal number of analog-to-digital converters are provided, wherein one group may be addressed as if it were one row and, respectively, pixel values of the pixels of one group may be converted to digital values by the group of analog-to-digital converters. For example, if the image sensor comprised $2^{24}$ pixels, each group of pixels could comprise 4096 pixels ($=2^{12}$) and, respectively, the image capturing device could comprise 4096 analog-to-digital converters. The storage of the pixel values may also be performed so that when values of pixels of one group are read they are stored to the image memory 422 to the location reserved for that group of pixels. This is illustrated in FIG. 11.

Images obtained from the pixel values may be used as such, i.e. the outline of the images correspond with the outline of the image sensor 105, or some kind of shape conversion may be performed. If the image to be obtained were desired to be in a rectangular form, e.g. an image having the resolution of V×W pixels, it may be possible to only use such area of pixels of the image sensor in which there are V rows and W columns. Thus, pixels outside this area are not used. Another option is to use an algorithm which converts the outline of the image sensor to rectangular form. This may be useful e.g. when the lens has a wide field of view which deforms the actual visual information (scene captured by the image capturing device). The algorithm may then be able to correct the deformations at least partly. An example of such kind of lens is the so-called fish eye lens. The "fisheye" image created by a super wide field-of-view lens may be very distorted effectively squeezing the image when moving away from the image centre. Hence, an appropriate algorithm might be able to correct such distortions.

If pixels of the image sensor 105 are not equally distributed but are, for example, arranged so that the distribution is more condense on the edges of the sensor and more sparse on the centre, the image capturing device may be provided with an algorithm or other appropriate means for correcting the effect of unequal distribution of pixels from the image to be formed.

In the figures and the above discussion the outline of the first region 102 i.e. the image sensor 105 was round but also other forms may be used. For example, the first region 102 may be elliptical. Also the outline of the semiconductor chip 100 need not be rectangular or square but it may be another kind of a polygon, such as a triangle, a pentagon, a hexagon, etc.

Cost advantages due to unused silicon area may be effectively used as there may be a need for additional applications like processing capabilities on a camera sensor and those can use the silicon area that is left unused by the round sensor. Savings on pixel transfer performance due to only transferring round area pixels, this may also mean that less energy is needed as less data is transferred. Designing for round lens may also benefit by designing more resolution on edges to take into account the lens mapping. This way the effective resolution in the resulting image may be more equally distributed across the image circle and the overall resolution may be lower and still preserve the wanted quality requirements.

According to an embodiment, a semiconductor chip 100 in which pixel density is not constant within the first region 102 of the semiconductor chip but changes e.g. towards the edges 106 of the first region 102, may also be used without other electric circuitry in the second region, which is not related to image capturing or controlling the image sensor. In other words, such an image sensor may be used e.g. with fish-eye lens(es) which may form more distorted image near the edges of the image area than in the centre of the image.

The various embodiments of the invention can be implemented with the help of computer program code that resides in a memory and causes the relevant apparatuses to carry out the invention. For example, a device may comprise circuitry and electronics for handling, receiving and transmitting data, computer program code in a memory, and a processor that, when running the computer program code, causes the device to carry out the features of an embodiment. Yet further, a network device like a server may comprise circuitry and electronics for handling, receiving and transmitting data, computer program code in a memory, and a processor that, when running the computer program code, causes the network device to carry out the features of an embodiment.

As described above, FIG. 9 is an example flowcharts of a method, which can be implemented by an apparatus and/or program product according to some example embodiments. It will be understood that each block of the flowchart, and combinations of blocks in the flowchart, may be implemented by various means, such as hardware, firmware, processor, circuitry and/or other device associated with execution of software including one or more computer program instructions.

For example, one or more of the procedures described above may be embodied by computer program instructions. In this regard, the computer program instructions which embody the procedures described above may be stored by a memory device 406 of an apparatus 400 employing an embodiment of the present invention and executed by a processor 408 in the apparatus. As will be appreciated, any such computer program instructions may be loaded onto a computer or other programmable apparatus (e.g., hardware)

to produce a machine, such that the resulting computer or other programmable apparatus embody a mechanism for implementing the functions specified in the flowchart blocks.

These computer program instructions may also be stored in a non-transitory computer-readable storage memory (as opposed to a transmission medium such as a carrier wave or electromagnetic signal) that may direct a computer or other programmable apparatus to function in a particular manner, such that the instructions stored in the computer-readable memory produce an article of manufacture the execution of which implements the function specified in the flowchart blocks. The computer program instructions may also be loaded onto a computer or other programmable apparatus to cause a series of operations to be performed on the computer or other programmable apparatus to produce a computer-implemented process such that the instructions which execute on the computer or other programmable apparatus provide operations for implementing the functions specified in the flowchart block(s). As such, the operations of FIG. 9, when executed, convert a computer or processing circuitry into a particular machine configured to perform an example embodiment of the present invention.

Figure 9:
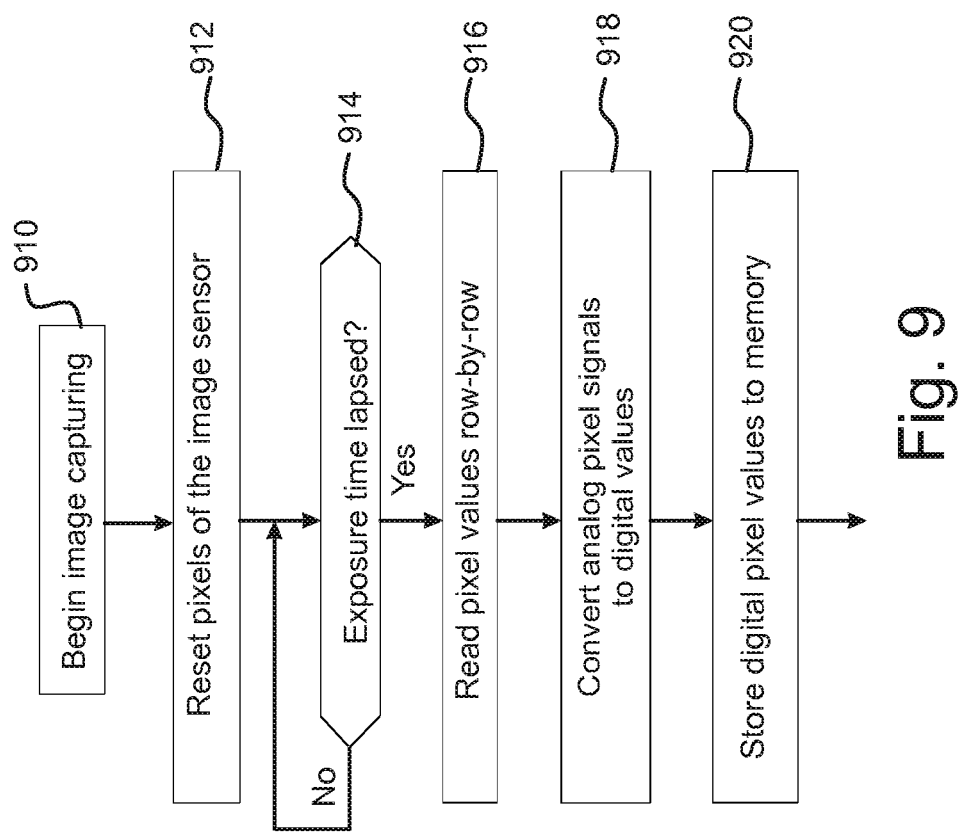
FIG. 9 illustrates an embodiment of a method as a flowchart.

Accordingly, the operations of FIG. 9 define an algorithm for configuring a computer or processing circuitry (e.g., processor) to perform an example embodiment. In some cases, a general purpose computer may be configured to perform the functions shown in FIG. 9 (e.g., via configuration of the processor), thereby transforming the general purpose computer into a particular machine configured to perform an example embodiment.

Accordingly, blocks of the flowcharts support combinations of means for performing the specified functions, combinations of operations for performing the specified functions and program instructions for performing the specified functions. It will also be understood that one or more blocks of the flowcharts, and combinations of blocks in the flowcharts, can be implemented by special purpose hardware-based computer systems which perform the specified functions or operations, or combinations of special purpose hardware and computer instructions.

In some embodiments, certain ones of the operations above may be modified or further amplified. Furthermore, in some embodiments, additional optional operations may be included. Modifications, additions, or amplifications to the operations above may be performed in any order and in any combination.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A semiconductor chip comprising at least:
   a set of photosensitive elements for forming electric signals on the basis of electromagnetic radiation received by the photosensitive elements; and
   other electronic circuitry;
   wherein a surface of the semiconductor chip comprises a first region and a second region;
   and wherein the set of photosensitive elements is located in the first region and the other electronic circuitry is located in the second region, and wherein a determined location of a photosensitive element in the first region and a mapping operation is used to determine a storage location for the status of the photosensitive element.

2. The semiconductor chip according to claim 1, wherein a circumference of the semiconductor chip is a polygon.

3. The semiconductor chip according to claim 1, wherein the circumference of the semiconductor chip is one of the following:
   a rectangle;
   a square;
   a triangle; and
   a hexagon.

4. The semiconductor chip according to claim 1, wherein a circumference of the first region corresponds with a circumference of a lens.

5. The semiconductor chip according to claim 4, wherein the circumference of the first region is a circle.

6. The semiconductor chip according to claim 1, wherein a distribution of the photosensitive elements is different in different parts of the first region.

7. The semiconductor chip according to claim 6, wherein distribution of the photosensitive elements is more condensed near an edge of the first region than in a centre of the first region.

8. The semiconductor chip according to claim 1, wherein the semiconductor chip is a complementary metal oxide semiconductor.

9. The semiconductor chip according to claim 1, wherein the first area also comprises amplifiers for the photosensitive elements.

10. The semiconductor chip according to the claim 1, wherein the second area comprises circuitry for at least one of the following:
    resetting the photosensitive elements; and
    reading the status of the photosensitive elements.

11. The semiconductor chip according to the claim 1, wherein the other electronic circuitry comprises one or more of the following:
    an analog-to-digital converter;
    an amplifier;
    a memory;
    an interface circuitry; and
    a processor.

12. A method, comprising:
    communicating with a set of photosensitive elements in a first region of a semiconductor chip to obtain electric signals formed by the set of photosensitive elements on the basis of electromagnetic radiation received by the photosensitive elements;
    communicating with other electronic circuitry in a second region of the semiconductor chip for other purposes than obtaining electric signals from the photosensitive elements;
    determining a location of a photosensitive element in the first area; and
    use the determined location and a mapping operation to determine a storage location for the status of the photosensitive element.

13. The method according to claim 12 further comprising:
    receiving electromagnetic radiation by at least one lens; and directing the received electromagnetic radiation by the at least one lens to the first region as a visual image comprising a circumference corresponding to a circumference of the first region.

14. The method according to claim 13 further comprising:
converting received electromagnetic radiation directed to the first region by the set of photosensitive elements into electric signals; and
reading the electric signals by a circuitry located outside the first region.

15. An apparatus comprising at least one processor, memory comprising computer program code, the memory and the computer program code configured to, with the at least one processor, cause the apparatus to perform at least the following:
communicating with circuitry in a first region of a semiconductor chip to obtain electric signals formed by a set of photosensitive elements on the basis of electromagnetic radiation received by the photosensitive elements;
communicating with other electronic circuitry in a second region of a semiconductor chip for other purposes than obtaining electric signals from the photosensitive elements;
determining a location of a photosensitive element in the first area; and
use the determined location and a mapping operation to determine a storage location for the status of the photosensitive element.

16. The apparatus according to claim 15, said memory comprising computer program code, which when executed by the at least one processor, cause the apparatus to:
convert received electromagnetic radiation directed to the first region by the set of photosensitive elements into electric signals; and
read the electric signals by a circuitry located outside the first region.

17. The apparatus according to claim 15, wherein the set of photosensitive elements is divided into subsets of photosensitive elements, said memory comprising computer program code, which when executed by the at least one processor, cause the apparatus to:
reset photosensitive elements of a subset;
wait an exposure time;
read the status of the subset of the photosensitive elements when the exposure time has elapsed;
store the status of the subset into a memory; and
perform the above operations for more than one subset.

18. A computer program product embodied on a non-transitory computer readable medium, comprising computer program code configured to, when executed on at least one processor, cause an apparatus or a system to:
communicate with a set of photosensitive elements in a first region of a semiconductor chip to obtain electric signals formed by the set of photosensitive elements on the basis of electromagnetic radiation received by the photosensitive elements;
communicate with other electronic circuitry in a second region of a semiconductor chip for other purposes than obtaining electric signals from the photosensitive elements;
determine a location of a photosensitive element in the first area; and
use the determined location and a mapping operation to determine a storage location for the status of the photosensitive element.

* * * * *